United States Patent [19]

Atwell, Jr. et al.

[11] 4,398,155
[45] Aug. 9, 1983

[54] MULTIPLE CLOCK SWITCHING CIRCUIT

[75] Inventors: William D. Atwell, Jr.; Marc Belleville, both of Austin, Tex.

[73] Assignee: Motorola, Inc., Schaumburg, Ill.

[21] Appl. No.: 273,815

[22] Filed: Jun. 15, 1981

[51] Int. Cl.³ .......................... H03K 5/26; H03L 7/00
[52] U.S. Cl. ..................... 328/73; 328/154;
328/55; 307/480; 375/107
[58] Field of Search .................. 328/72, 73, 152, 154,
328/55; 375/107, 119; 307/480

[56] References Cited

U.S. PATENT DOCUMENTS

| | | | |
|---|---|---|---|
| 3,029,389 | 4/1962 | Morphet | 328/55 |
| 3,996,523 | 12/1976 | Schmid | 328/72 |
| 4,039,960 | 8/1977 | Clark | 307/480 |
| 4,206,414 | 6/1980 | Chapman | 328/72 |

*Primary Examiner*—John S. Heyman
*Attorney, Agent, or Firm*—Anthony J. Sarli, Jr.; Jeffrey Van Myers; Robert L. King

[57] ABSTRACT

A circuit for switching between multiple asynchronous clocks is provided. A synchronizer comprising D-type flip-flops, which are controlled by a clock change signal, are provided for each control signal being switched. Output signals provided by the synchronizers are used to control MOS transistor gates which switch the asynchronous clocks to the circuit output. The synchronizers also control a clamping transistor gate which clamps the circuit output to a reference during a switching operation. An additional synchronizer provides synchronization between the clock change signal and the circuit output allowing the circuit output to be interrupted at a known state.

4 Claims, 4 Drawing Figures

MULTIPLE CLOCK SWITCHING CIRCUIT

BACKGROUND OF THE INVENTION

1. Field of the Invention

This invention relates generally to multiple clock switching circuits and more particularly to switching circuits for selectively switching between multiple asynchronous or synchronous clocks.

2. Description of the Prior Art

Typically, a system requiring the selective switching between multiple asynchronous and synchronous clock signals utilizes independent circuits to switch, either manually or otherwise, each clock into the system. A disadvantage of the prior art is the generation of excessively brief timing pulses which can produce an unknown state within the clock drive circuitry immediately following switching between asynchronous clocks. As a result, a reinitialization is generally required before a valid state can be obtained using the new clock. Usually, a reinitialization of the clock driven circuit results in a considerable delay before valid data is realized at the driven circuit's output. A further disadvantage of the prior art occurs when the clock driven circuit is reinitialized and the circuit's previous logic state is thereby lost.

SUMMARY OF THE INVENTION

It is an object of the present invention to provide an improved multiple clock switching circuit.

Another object of the invention is to provide a multiple asynchronous clock switching circuit which switches the multiple clocks synchronously.

Yet another object of the invention is to provide an improved multiple asynchronous clock switching circuit which inhibits clock pulses during switching and thus requires no reinitialization within the clock driven circuitry.

In carrying out the above and other objects and advantages of the present invention, there is provided, in one form, a clock switching circuit wherein in response to a clock change signal, first and second synchronizers provide respective first and second gate signals, after the levels of respective first and second clock signals change twice. Each gate signal controls a gate which switches the respective clock signal to a clock output and a third gate which clamps the clock output to a reference when neither the first nor second gate signal is present. In response to a reset signal which disables the synchronizers, a fourth gate switches a master clock to the clock output. A third synchronizer may be added to synchronize the clock change signal with the clock output. More than two asynchronous clock signals may be switched by the use of additional synchronizers and associated circuitry. The above and other objects, features and advantages of the present invention will be more clearly understood from the following detailed description taken in conjunction with the accompanying drawings.

DESCRIPTION OF THE PREFERRED EMBODIMENT

Figure 1:
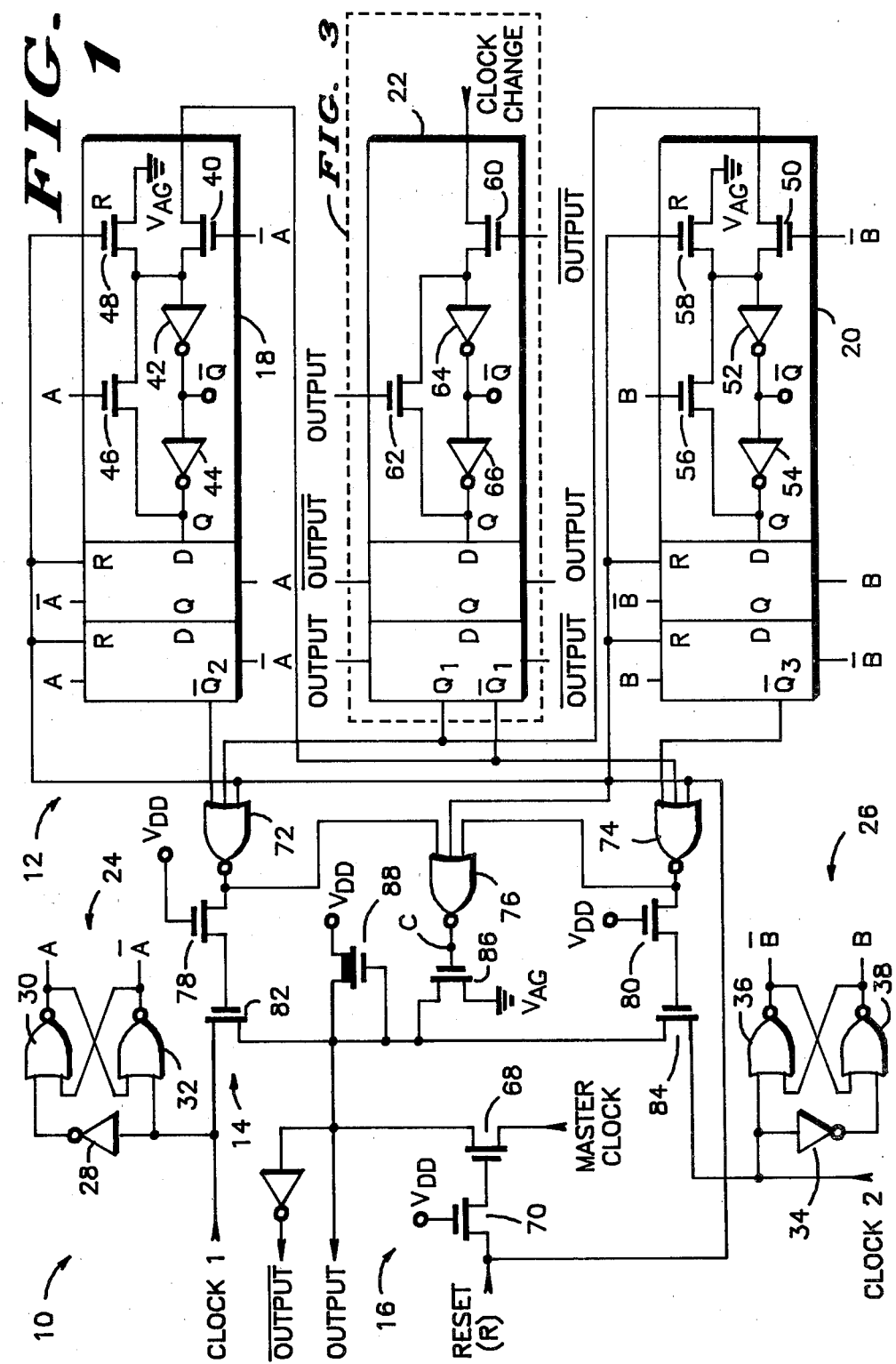
FIG. 1 is a schematic diagram illustrating one preferred embodiment of the invention.

Shown in FIG. 1 is a clock switching circuit 10 for switching between multiple clock signals, constructed in accordance with the preferred embodiment of the present invention. The clock switching circuit 10 is comprised generally of a synchronizer portion 12, a gating portion 14, and a reset portion 16.

In the preferred form, the synchronizer portion 12 includes synchronizers 18, 20 and 22, each of which is comprised of three series-connected D-type flip flops, and complementors 24 and 26 comprising an inverter 28 and NOR gates 30 and 32 and an inverter 34 and NOR gates 36 and 38, respectively. The first D-type flip flop of the synchronizer 18 has a gate 40 with an input coupled to a clock change from synchronizer 22 signal and an output coupled to an inverter 42 having an outer ($\overline{Q}$) coupled to an inverter 44. The inverter 44 has an output which is the Q output of the first D-type flip flop of the synchronizer 18 and is coupled to a gate 46 which is coupled to a reference $V_{AG}$ via a gate 48. The output of the gate 40 is also coupled to the node between the gates 46 and 48. In the illustrated form, all of the gates are conventional MOS transistors which are clocked in a conventional manner by the signals illustrated in FIG. 2. The first clock signal is applied to the input of the complementor 24 to generate the complementary non-overlapping signals A and $\overline{A}$ wherein the signal A is identical to the clock 1 signal. The gates 40, 46 and 48 have signals $\overline{A}$, A, and a reset signal R applied to the respective control inputs thereof. The Q output of the first D-type flip flop of the synchronizer 18 is coupled to the D input of the second D-type flip flop and the Q output of the second D-type flip flop is connected to the D input of the third D-type flip flop. The second and third flip flops of the synchronizer 18 (not shown in detail) are identical to the first flip flop with the exception that the complement of the control signals utilized in the first flip flop are applied to the corresponding gate control inputs of the second flip flop with the exception of the reset signal R.

In the synchronizer 20, the clock change signal from synchronizer 22 is coupled to an input of a gate 50 which is coupled to an inverter 52 having its output ($\overline{Q}$) coupled to an inverter 54. The inverter 54 has an output which is the Q output of the first D-type flip flop of synchronizer 20 and is coupled to a gate 56 which is coupled to the reference $V_{AG}$ via a gate 58. The output of the gate 50 is also coupled to the node between the gates 56 and 58. The clock 2 signal is applied to the input of the complementor 26 to generate the complementary non-overlapping signals B and $\overline{B}$ wherein the signal B is identical to the clock 2 signal. The gates 50, 56 and 58 have the signals $\overline{B}$, B and R applied to the respective control inputs thereof. The second and third flip flops of the synchronizer 20 (not shown in detail) are identical in structure to the first flip flop with the exception that the complement of the control signals utilized in the first flip flop are applied to the corresponding gate control inputs in the second flip flop with the exception of the reset signal R.

In the synchronizer 22, the clock change signal is applied to the first D-type flip flop of the synchronizer 22 at the input of a gate 60 which is coupled to a gate 62 and an inverter 64. Gate 60 is controlled by the complement of the clock output. The control input of the switch 62 is coupled to the clock output and the output of the inverter 64, $\overline{Q}$, is coupled to an inverter 66 having its output coupled to the output of the switch 62 and the Q output. The second and third flip flops of the synchronizer 22 (not shown in detail) are identical in structure to the first flip flop with the exception that the complement of the control signals utilized in the first flip flop are applied to the corresponding gate control inputs in the second flip flop.

In the reset portion 16, the reset signal R is coupled to the control input of a gate 68 via a bootstrap transistor 70 which is controlled by the reference voltage $V_{DD}$ in a standard bootstraping configuration. The gate transistor 68 has an input coupled to a master clock signal and an output coupled to the clock output of circuit 10. In the form shown in FIG. 2, the master clock signal has a higher frequency than the clock 1 and clock 2 signals. The master clock may be used as a reinitialization signal for other circuitry and its high frequency decreases the time required to reinitialize.

In the gating portion 14, a three input NOR gate 72 and a three input NOR gate 74 each have an input coupled to the reset signal R. The complement of the Q output ($\overline{Q}_2$) of the third flip flop of the synchronizer 18 and the Q output ($Q_1$) of the third flip flop of the synchronizer 22 are coupled to respective inputs of the NOR gate 72. The complement of the Q output ($\overline{Q}_3$) of the third flip flop of the synchronizer 20 and the complement of the Q output ($\overline{Q}_1$) of the third flip flop of the synchronizer 22 are coupled to respective inputs of the NOR gate 74. The $\overline{Q}_1$ output of the synchronizer 22 is connected to the input of the gate transistor 50 and the $\overline{Q}_1$ output of the synchronizer 22 is connected to the input of the gate transistor 40. The output of the NOR gate 72 is coupled to an input of a three input NOR gate 76 and to the input of a bootstrap transistor 78. The output of the NOR gate 74 is coupled to another input of the NOR gate 76 and to the input of a bootstrap transistor 80. The gate of the bootstrap transistors 78 and 80 are coupled to the reference voltage $V_{DD}$ in a standard bootstraping configuration. The other input of the NOR gate 76 is coupled to the reset signal R and the outputs of the bootstrap transistors 78 and 80 are coupled to the gates of gate transistors 82 and 84, respectively. The gate transistors 82 and 84 couple respective clock 1 and clock 2 signals to the clock output. The output of the NOR gate 76 is coupled to the gate of a clamping transistor 86 which clamps the clock output to the reference voltage $V_{AG}$ whenever the NOR gate 76 output signal is in a high state. Preferably, a depletion-type pull-up transistor 88 is provided with the drain thereof coupled to $V_{DD}$ and the source and gate thereof coupled to the clock output to compensate for parasitic leakage when the clock output is at a high level.

Figure 2:
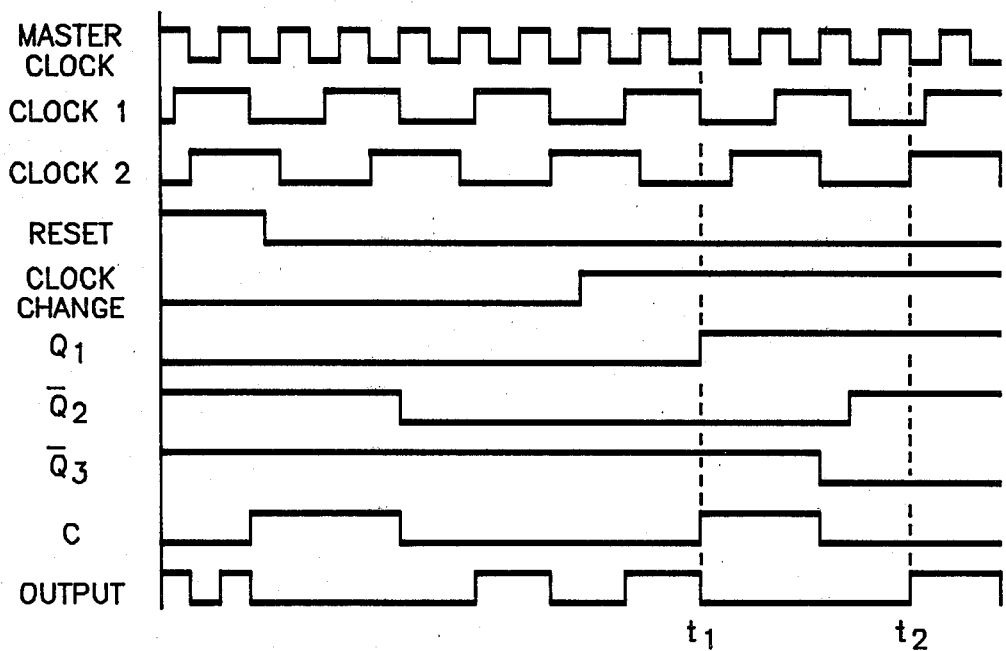
FIG. 2 is a graphic timing diagram for the schematic embodiment shown in FIG. 1.

For the purpose of illustrating the operation of the clock switching circuit 10, assume that a reset signal is initially present as in FIG. 2 so that the master clock signal is present at the clock output. If no clock change signal is present initially, the $Q_1$ output will be low and $\overline{Q}_1$ will be high. Clock 1 and clock 2 cause the outputs A and $\overline{A}$ and B and $\overline{B}$ of the complementors 24 and 26, respectively, to toggle. As long as the reset signal R remains high, the $\overline{Q}$ outputs of synchronizers 18 and 20 will remain high. Therefore the outputs of both NOR gates 72 and 74 will be low. Although the duration of the reset signal R is substantially arbitrary, it is preferred that the reset signal R be externally synchronized with the master clock signal to assume that the gate transistor 68 will be turned off, disconnecting the master clock from the clock output, only after the master clock has transitioned to the low level. Simultaneously, the output of the NOR gate 76 will change from a low level to a high level to turn on the clamp transistor 86 clamping the clock output to the low level until one of the synchronizers 18 and 20 asserts control of the clock output via respective NOR gates 72 and 74.

If, as shown in FIG. 2, the clock 1 signal is low when the reset signal transitions to the low level, the A output from the NOR gate 32 will be at the high level. The high level $\overline{Q}_1$ output from the synchronizer 22 resulting from the absence of the clock change signal will be immediately clocked through the first flip flop of synchronizer 18 onto the D input of the second flip flop. When the clock 1 signal next transitions to the high state, the output A from the NOR gate 30 becomes high, clocking the high level on the D input of the second flip flop through to the D input of the third flip flop. When the asynchronous clock 1 again transitions to the low state, $\overline{A}$ becomes high again, clocking the high level on the input of the third flip flop to the $Q_2$ output of the synchronizer 18. As a result, the output from the NOR gate 72 changes from a low level to a high level, causing the output of the gate 76 to become low. The low level at the gate of clamp transistor 86 disconnects the clock output from $V_{AG}$ while the high level now present at the control input of the switch 82 connects the clock 1 to the output.

Sometime after the clock switching circuit 10 has switched to the clock 1 signal, a clock change signal is received at the input of the gate 60 indicating that the clock output should be switched to clock 2. Since the clock change signal happens to have been received when the output from clock 1 is at a low level, the clock change signal will be immediately clocked through to the Q output of the first flip flop of synchronizer 22. When the clock output signal transitions to a high level, the clock change signal is clocked through the second flip flop of the synchronizer 22. As soon as the level of the clock 1 output signal again transitions to a low state, the clock change signal is clocked through the third flip flop of the synchronizer 22 and the $Q_1$ output immediately goes to a high level and $\overline{Q}_1$ becomes low. In response, the output of the NOR gate 72 becomes low and clock 1 is disconnected from the clock output. Since the output from the NOR gate 74 remains at a low level, the output of the NOR gate 76 becomes high again, thereby clamping the clock output to the reference $V_{AG}$. In this manner, the synchronizer 22 synchronizes the clock change signal with the clock output to prevent decoupling of the clock 1 signal unitl the clock output has transitioned to the low level.

The $Q_1$ signal, received at the input of the gate 50, is immediately clocked through the first flip flop of the synchronizer 20, since the clock 2 signal is at a low level and thus $\overline{B}$ is at a high level. As soon as the clock 2 signal transitions to a high level, the $Q_1$ signal is clocked through to the Q output of the second flip flop of the synchronizer 20. When the clock 2 signal transitions low again, the $Q_1$ signal is clocked through the third flip flop of the synchronizer 20 forcing $Q_3$ to a high level and $\overline{Q}_3$ to a low level. In response to all three input signals being low, the gate 74 produces a high level output, turning on the gate transistor 84 and switching the clock 2 signal onto the clock output. The high level output of the NOR gate 74 also forces the output of the NOR gate 76 to a low level, disconnecting the clock output from the reference voltage $V_{AG}$.

Since the $\overline{Q}_1$ signal is applied to the input of the gate transistor 40 of the synchronizer 18 when the clock 1 signal is at a low level and $\overline{A}$ is at a high level, the low level of the $\overline{Q}_1$ signal will be immediately clocked through the first flip flop of the synchronizer 18. When the clock 1 signal transitions to a high level, the low level of the $\overline{Q}_1$ signal will be clocked through the second flip flop of the synchronizer 18, and, similarly, when the clock 1 signal again transitions to a low level, the $Q_2$ output of the synchronizer 18 will output the low level of the $\overline{Q}_1$ signal. Since the $\overline{Q}_2$ signal will now be at a high level, the output from the NOR gate 72 will be locked at the low level even if the clock change signal synchronized as the $Q_1$ signal should thereafter go low, until $\overline{Q}_1$ has been synchronized with the clock 1 signal by synchronizer 18. In other words, the clock 2 signal will be coupled to the clock output until the clock change signal returns to a low level and has been synchronized with the clock 1 signal.

Figure 3:
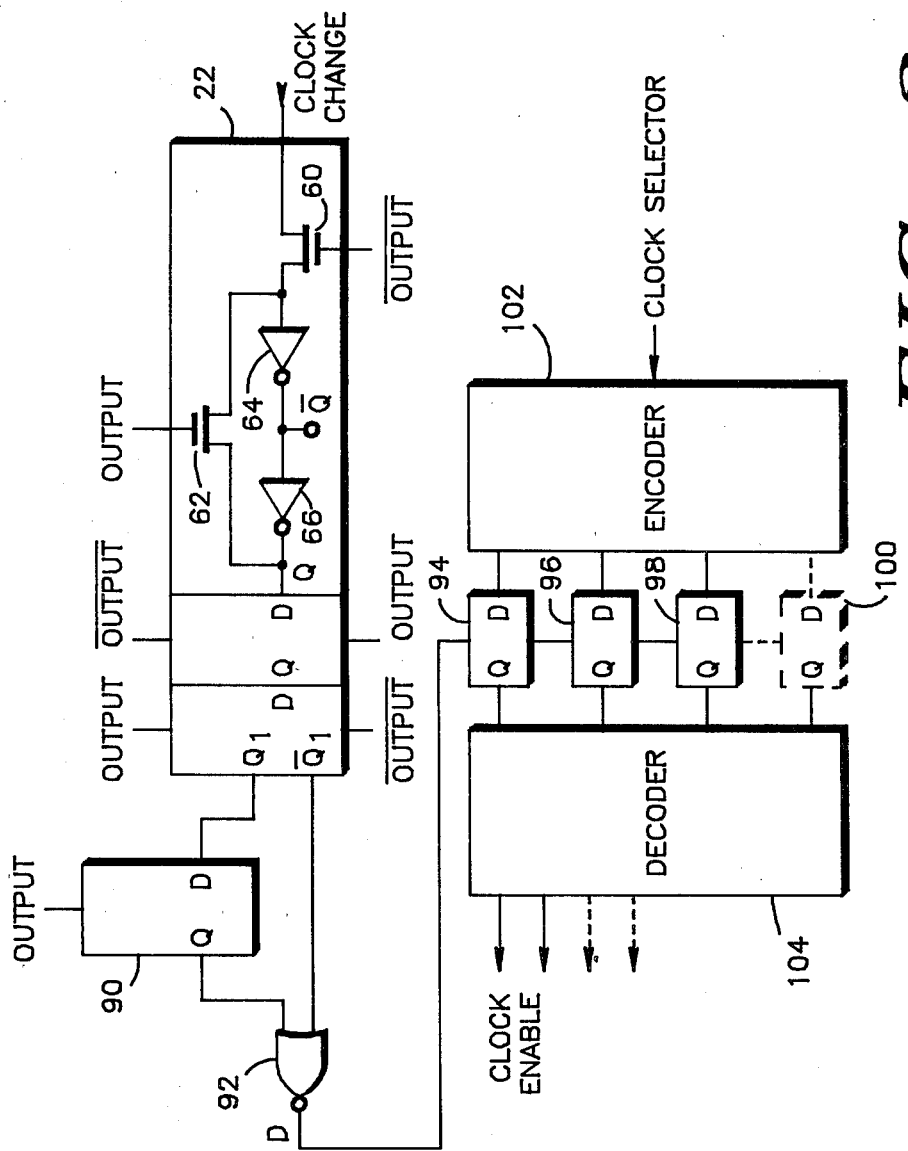
FIG. 3 is a schematic diagram illustrating another embodiment of a portion of the invention as shown in FIG. 1.

Although the invention has been described in terms of switching between a first and a second clock signal, more than two asynchronous clocks may be switched by modifying the circuit 10 to include additional synchronizers similar to synchronizers 18 and 20 for each such additional clock. FIG. 3 illustrates a modified use of the synchronizer 22. In this form, the clock change signal is a signal which represents a request to change from the presently switched clock signal to a different clock signal. For each such additional clock signal which is added to the circuit 10, an additional synchronizer (not shown) such as the synchronizers 18 and 20, an additional complementor (not shown) such as the complementors 24 and 26, an additional NOR gate (not shown) such as the NOR gates 72 and 74, and an additional gate transistor (not shown) such as the gate transistors 82 and 84 are required. The output from each additional NOR gate must be connected to an additional input of the NOR gate 76, to clamp the clock output to $V_{AG}$ during the switching between clock signals. The timing diagram for the circuit 10 when modified as shown in FIG. 3 to switch between numerous asynchronous clock signals is illustrated in FIG. 4.

As shown in FIG. 3, the synchronizer 22 is structurally identical to that shown in FIG. 1. The $Q_1$ output of the third D-type flip flop of the synchronizer 22 is coupled to an input of a D-type flip flop 90 and the $\overline{Q}_1$ output is coupled to an input of a two input NOR gate 92. The output of the D-type flip flop 90 is coupled to an input of the NOR gate 92 which has an output coupled to clock inputs of latches 94, 96, 98 and 100 which, in the preferred form, are D-type flip flops. An encoder 102 has a plurality of outputs coupled to a respective one of the inputs of the latches 94, 96, 98 and 100. The latches 94, 96, 98 and 100 have the outputs thereof coupled to respective inputs of a decoder 104 having a plurality of clock enable outputs each of which would be coupled to a respective input of a synchronizer such as the synchronizers 18 and 20. The complement of each of the clock enable outputs would be coupled to an input of a respective NOR gate such as the NOR gates 72 and 74.

Figure 4:
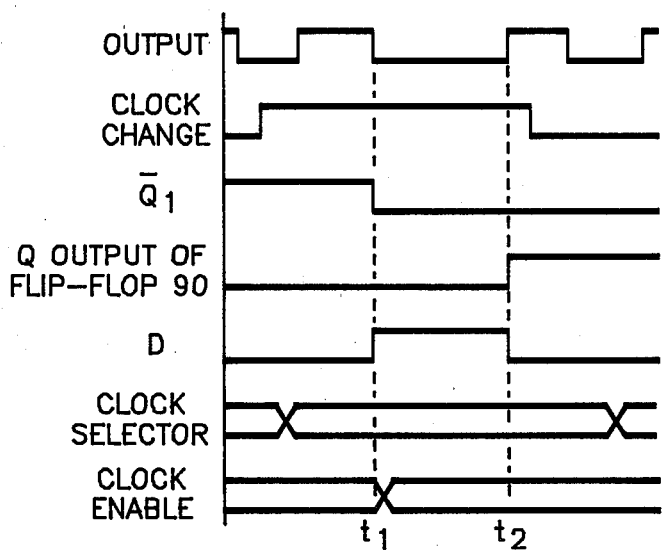
FIG. 4 is a graphic timing diagram for the schematic embodiment shown in FIG. 3.

In operation, the clock output will be changed only after the clock change signal transitions from a low level to a high level as shown in FIG. 4. In this particular illustration, at the time a clock change signal is received, the high level thereof is immediately clocked through the first flip flop of the synchronizer 22 since the clock output is at a low level. When the clock output next transitions to a high level, the clock change signal is clocked through to the output of the second flip flop of the synchronizer 22, and when the clock output again transitions to the low level the clock change signal is clocked through to the $Q_1$ output of the third flip flop of the synchronizer 22. At this time, both the output of the flip flop 90 and $\overline{Q}_1$ are at a low level, so that signal D at the output of the NOR gate 92 goes to a high level. By the time the signal D changes from a low level to a high level, external conventional logic (not shown) has generated a clock selector signal which is coupled to the encoder 102 and then encoded onto the outputs thereof. The encoder 102 may be of any form, and would not be needed if the clock selector signal is already in an appropriate coded form so long as each asynchronous clock signal has a corresponding clock selector signal. In either form, the encoded output of the encoder 102, present at the inputs of the latches 94, 96, 98 and 100 when the signal D goes to a high level, will be latched to the input of the decoder 104. In response to the output of the latches 94, 96, 98 and 100, the output of the decoder 104 changes state and enables the appropriate synchronizer for the clock signal which is being selected for switching to the clock output. More particularly, each output of the decoder 104 is coupled to the input gate transistors of a respective synchronizer, such as the synchronizers 18 and 20, and the complement of each output of the decoder 104 is coupled to a respective NOR gate such as the NOR gates 72 and 74. Since only one of the clock enable outputs of the decoder 104 will be at a high level at any one time, only the selected synchronizer will be enabled.

After a new clock enable signal has been produced at the time $t_1$, the circuit 10 during the interval $t_{1-t2}$ shown in FIG. 4 clamps the output to $V_{AG}$ and then switches the new clock signal into the output as previously discussed during the same time interval $t_1$-$t_2$ shown in FIG. 2. Once the output rises to a high level, the output of the D-type flip flop 90 returns to a high level and the signal D drops to a low level. After the signal D drops to a low level, the inputs of the decoder 104 are latched and the coded output of the encoder 102 may change in anticipation of switching a new asynchronous clock. Once the signal D has dropped to a low level, a change in the clock selector signal input has no effect on the output signal. Thus a circuit which can switch multiple asynchronous clocks while the output always remains in a known state has been provided.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A circuit for switching between first and second clock signals in response to a control signal, comprising:

first synchronizing means responsive to the control signal, for providing a first gate signal in response to receiving the first clock signal at a predetermined binary level within at least two pulses after the initiation of the control signal;

second synchronizing means responsive to the control signal, for providing a second gate signal in response to receiving the secondary clock signal at said predetermined binary level within at least two pulses after the termination of the control signal;

first gating means for selectively coupling the first clock signal to an output in response to the first gating signal;

second gating means for selectively coupling the second clock signal to the output in response to the second gating signal; and gated clamping means for selectively clamping all clock signals at the output to a reference voltage in the absence of the first and second gating signals.

2. The circuit of claim 1 wherein the first and second synchronizing means are further characterized as receiving a reset signal, and producing the first and second gate signals, respectively, only in the absence of the reset signal.

3. The circuit of claim 2 further comprising:
third gating means for selectively coupling a third clock signal to the output in response to the reset signal.

4. The circuit of claims 1, 2 or 3 further comprising:
third synchronizing means responsive to the control signal, for receiving the clock signal coupled to said output, and providing the control signal to the first and second synchronizing means in response to the received clock signal transitioning from said predetermined level to a second predetermined level and back to said first predetermined level after the initiation of the control signal.

* * * * *

UNITED STATES PATENT AND TRADEMARK OFFICE
CERTIFICATE OF CORRECTION

PATENT NO. : 4,398,155

DATED : August 9, 1983

INVENTOR(S) : William D. Atwell, Jr. et al.

It is certified that error appears in the above-identified patent and that said Letters Patent are hereby corrected as shown below:

In column 2, line 22, add --signal-- after "change" and delete "signal" after "22".

In column 2, line 23, change "outer" to --output--.

In column 6, line 43, change "$t_{1-t2}$" to --$t_1 - t_2$--.

Signed and Sealed this

Eleventh Day of October 1983

[SEAL]

Attest:

Attesting Officer

GERALD J. MOSSINGHOFF

Commissioner of Patents and Trademarks